United States Patent
Kreuder et al.

[11] Patent Number: 5,814,244
[45] Date of Patent: Sep. 29, 1998

[54] POLYMERS COMPRISING TRIAYLAMINE UNITS AS ELECTROLUMINESCENCE MATERIALS

[75] Inventors: Willi Kreuder, Mainz; Hans-Heinrich Hörhold; Henning Rost, both of Jena, all of Germany

[73] Assignee: Hoechst Aktiengesellschaft, Frankfurt, Germany

[21] Appl. No.: 711,367

[22] Filed: Sep. 3, 1996

[30] Foreign Application Priority Data

Sep. 4, 1995 [DE] Germany ............ 195 32 574.5
Sep. 27, 1995 [DE] Germany ............ 195 35 938.0

[51] Int. Cl.$^6$ ............ C08G 12/04; C09K 11/06; H05B 33/14
[52] U.S. Cl. ............ 252/301.16; 313/504; 428/690
[58] Field of Search ............ 252/301.16, 301.26, 252/301.22, 301.31, 301.32, 301.24; 313/504; 428/690

[56] References Cited

U.S. PATENT DOCUMENTS

| | | | |
|---|---|---|---|
| 3,995,299 | 11/1976 | Partridge | 357/8 |
| 4,423,203 | 12/1983 | Corvan et al. | 528/266 |
| 5,503,910 | 4/1996 | Matsuura et al. | 428/690 |
| 5,536,949 | 7/1996 | Hosokawa et al. | 428/690 |

FOREIGN PATENT DOCUMENTS

| | | |
|---|---|---|
| 0557534 | 9/1983 | European Pat. Off. |
| 0610514 | 8/1994 | European Pat. Off. |
| WO 90/13148 | 11/1990 | WIPO |

OTHER PUBLICATIONS

Sokolik, et al. *Jour. Appl. Phys.* vol. 74, "Blue–Light electroluminescence from p–phenylene vinylene–base & polymers", Sep. 1, 1993, pp. 3584–3586.

Saito et al. *Appl. Phys. Lett.*, vol. 56, pp. 799–801 "Blue Light–emitting Organic electroluminescent Devices," Feb. 26/1990.

Patent Abstracts of Japan, vol.. 95, No. 002 & JP A 07 053955, Feb. 28, 1995.

Patent Abstracts of Japan, vol. 96, No. 002 & JP A 08 054746, Feb. 27, 1996.

Physica B. Dec. 1995, Elsevier, Netherlands, Bd. 216, No. 1–2, ISSN 0921–4526, pp. 43–52, XP002018079 by Heun et al. entitled "Hole Transport in Triarylamine Doped Polymers".

Chemical Physics, Jan. 1, 1995, Netherlands, Bd. 190, No. 1, ISSN 0301–0104, pp. 31–41, XP002018080 by Van Der Auweraer et al. entitled An Asessment of the Role of Polaron Formation to Hole Transport in a Triarylamine Doped Polymer.

Macromolecules (1996), 29 (7), 2359–64 CODEN: MAMOBX; ISSN 0024–9297, 1996 XP002018726 by Kolb et al. entitled A New Polymeric Triarylamine and its Use as a Charge Transport Layer for Polymeric LED's.

*Primary Examiner*—Melissa Bonner
*Attorney, Agent, or Firm*—Frommer Lawrence & Haug LLP

[57] ABSTRACT

An electroluminescence material comprising one or more polymers which comprise structural units of the formula (I),

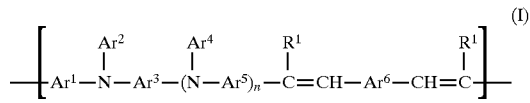

where the symbols and indices have the following meanings:

$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more bridges and/or be condensed and may be unsubstituted or substituted, where $Ar^1$, $Ar^3$, $Ar^5$ and $Ar^6$ are each divalent and $Ar^2$ and $Ar^4$ are each monovalent;

$R^1$ is H, a hydrocarbon radical having from 1 to 22 carbon atoms, which may be unsubstituted or substituted, preferably by F, and can also contain heteroatoms, preferably 0, or $Ar^7$, where $Ar^7$ is, independently of $Ar^{1-6}$, as defined for $Ar^{1-6}$;

n is 0, 1 or 2.

The electroluminescence material of the invention has, inter alia, a low threshold voltage of the electroluminescence and a high efficiency, although the polymers are not conjugated.

14 Claims, No Drawings

POLYMERS COMPRISING TRIAYLAMINE UNITS AS ELECTROLUMINESCENCE MATERIALS

RELATED APPLICATIONS

This application claims priority to German Application Nos. 19532574.5 and 19535938.0, filed Sep. 4, 1995 and Sep. 27, 1995, respectively, each incorporated herein by reference.

BACKGROUND OF THE INVENTION

1. Field of the Invention

This present invention relates to polymers containing triarylamine units, and their use as electroluminescence materials.

2. Description of the Related Art

Several publications are referenced in this application. These references describe the state of the art to which this invention pertains, and are incorporated herein by reference.

There is a great industrial need for large-area, solid-state light sources for a series of applications, predominantly in the field of display elements, VDU technology and lighting engineering. The requirements made of these light sources can at present be met completely satisfactorily by none of the existing technologies.

As an alternative to conventional display and lighting elements such as incandescent lamps, gas-discharge lamps and non-self-illuminating liquid crystal display elements, electroluminescence (EL) materials and devices such as light-emitting diodes (LEDs) have been in use for some time.

DE-A 25 45 784 (corresponds to U.S. Pat. No. 3,995,299) describes an electroluminescence device having a radiation source comprising a layer of an amorphous or predominantly amorphous polymer material having an sufficient electrical charge mobility and a low ionization potential, a strong electron donor, a strong electron acceptor and preferably at least one luminescing additive, with there being provided electrical connections through which an electric current can be passed through the thickness of the layer for exciting radiation therefrom.

Polymer materials which have been used are conjugated polymers such as poly(p-phenylenevinylene) (see, for example, WO-A 90/13148), and also non-conjugated polymers (see, for example, I. Sokolik et al., J. Appl. Phys. 1993, 74, 3584), with conjugated materials generally having the advantage of a higher charge carrier mobility and thus better efficiencies and lower threshold voltages.

Besides devices based on polymers, low molecular weight organic electroluminescence devices have also been known for some time. Saito et al. (Appl. Phys. Lett. 1990, 56, 799) describe such devices having triarylaminestilbenes as light-emitting layers.

Although good results have been obtained using these materials, the property profile of these compounds is still capable of considerable improvement.

In addition, since the development of electroluminescence materials, in particular those based on polymers, can in no way be regarded as concluded, the manufacturers of lighting and display devices are interested in a great variety of electroluminescence materials for such devices.

This is because, inter alia, only the interaction of the electroluminescence materials with the further components of the devices allows conclusions as to the quality of the electroluminescence material too.

OBJECT OF THE INVENTION

It is therefore an object of the present invention to provide new electroluminescence materials which are suitable for use in lighting or display devices and which improve the property profile of these devices.

SUMMARY OF THE INVENTION

It has now surprisingly been found that certain polymers comprising triarylamine units are particularly suitable as electroluminescence materials.

Some of these compounds are known as photosensitive components for electrophotographic processes and as sensitizers for electrically photosensitive dyes (U.S. Pat. No. 4,323,203), but their suitability as electroluminescence materials cannot be deduced therefrom.

The invention accordingly provides an electroluminescence material comprising one or more polymers which comprise structural units of the formula (I),

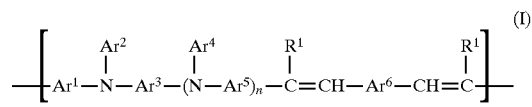

where the symbols and indices have the following meanings:
$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more, preferably one, bridge and/or be condensed, preferably have from 4 to 400, particularly preferably from 4 to 100, very particularly preferably from 4 to 20, carbon atoms and may be unsubstituted or substituted, where $Ar^1$, $Ar^3$, $Ar^5$ and $Ar^6$ are each divalent and $Ar^2$ and $Ar^4$ are each monovalent;

$R^1$ is H, a hydrocarbon radical having from 1 to 22 carbon atoms which may be unsubstituted or substituted, preferably by F, and can also contain heteroatoms, preferably O, or $Ar^7$, where $Ar^7$ is, independently of $Ar^{1-6}$, as defined for $Ar^{1-6}$;

n is 0, 1 or 2, preferably 0 or 1, particularly preferably 0.

Preference is given to polymers consisting of structural units of the formula (I). The electroluminescence material of the invention has, inter alia, a low threshold voltage of the electroluminescence and a high efficiency, although the polymers are not conjugated. In addition, in multilayer structures it is particularly suitable as one of the components of the hole-conductor layer.

For the purposes of the invention, electroluminescence materials are materials which can be used as active layer in an electroluminescence device. Active layer means that the layer is capable of emitting light on application of an electric field (light-emitting layer) and/or that it improves the injection and/or transport of the positive and/or negative charges (charge-injection or charge-transport layer).

The invention accordingly also provides for the use of a polymer comprising different structural units of the formula (I) as electroluminescence material, in particular as hole-conducting layer.

The polymers of the invention generally have from 2 to 1000, preferably from 3 to 500, particularly preferably from 4 to 300, structural units preferably of the formula (I).

DESCRIPTION OF THE PREFERRED EMBODIMENTS

Preference is given to polymers comprising structural units of the formula (I) in which the symbols and indices have the following meanings:

$Ar^1$, $Ar^3$, $Ar^5$, $Ar^6$ are identical or different, preferably identical

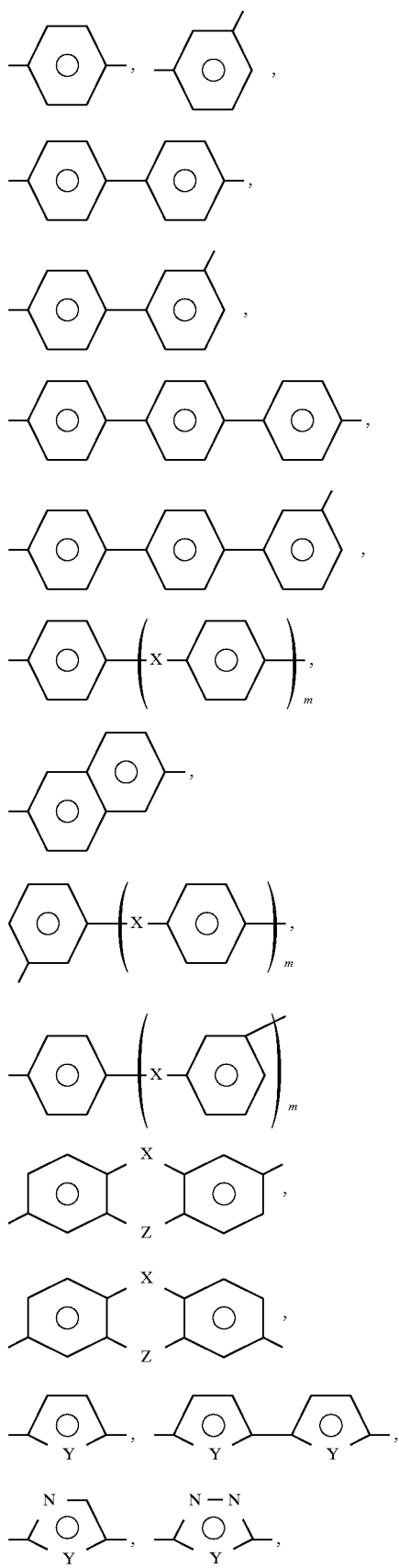

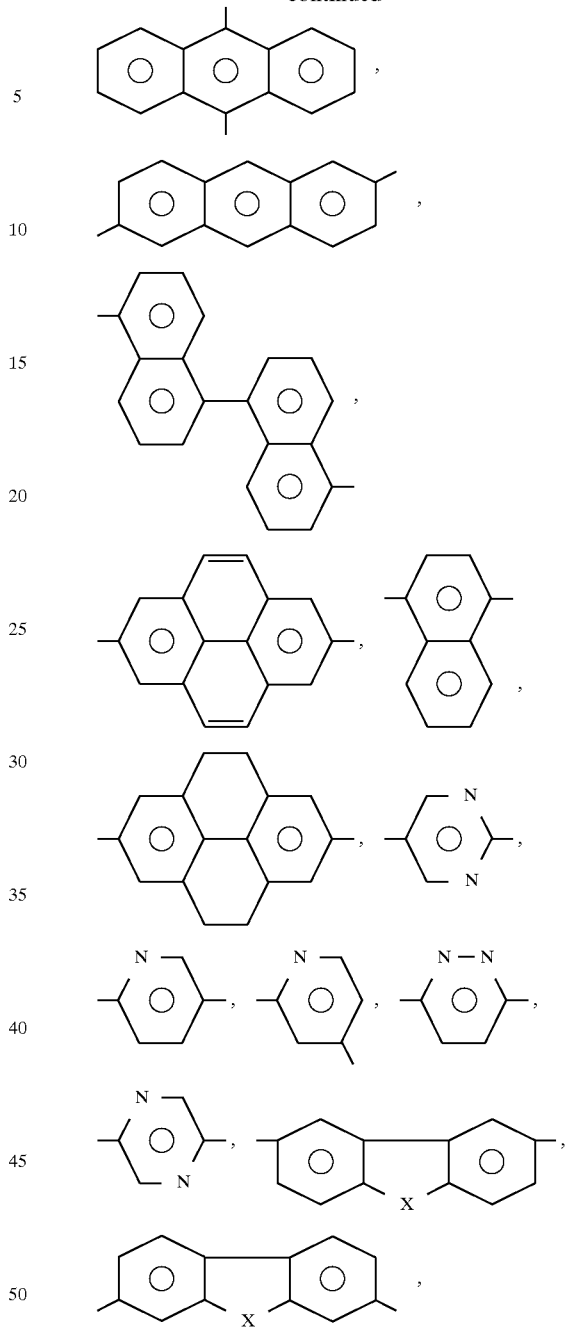

m is from 1 to 20, preferably 1, 2 or 3, particularly preferably 1, and only for Ar⁶ m is preferably>1;

Ar², Ar⁴ are identical to or different from Ar¹, Ar³, Ar⁵ and Ar⁶ and are as defined for Ar¹, Ar³, Ar⁵ and Ar⁶, where only one of the two possible binding points to the polymer is realized in each case;

Ar¹, Ar², Ar³, Ar⁴, Ar⁵, Ar⁶ can be identically or differently substituted by one or more radicals R²–R⁷;

X, Z are identical or different and are each a single bond, —O—, —S—, C(O)—, —SO—, —SO₂—, —CR²R³—, —CR⁴=CR⁵— or —CHR⁶—CHR⁷—;

Y is —O—, —S— or —NR⁸—;

R¹ is H, a hydrocarbon radical having from 1 to 22 carbon atoms or Ar⁷, where Ar⁷ is as defined for Ar¹ to Ar⁶;

$R^2$–$R^7$ are identical or different and are each H, an alkyl group having from 1 to 22, preferably from 1 to 12, carbon atoms, where it is also possible for one or two non-adjacent $CH_2$ groups to be replaced by —O—, —S—, —CO—, —CO—O—, —O—OC— or —Si(CH$_3$)$_2$—, —CF$_3$, —Ph, —O—Ph, —S—Ph, —SO—Ph, —SO$_2$—Ph, F, Cl, Br, I or —CN;

$R^8$ is identical to or different from $R^1$ and is as defined for $R^1$;

n is 0, 1 or 2, preferably 0 or 1, particularly preferably 0.

Particular preference is given to polymers comprising structural units of the formula (I) in which the symbols and indices have the following meanings:

$Ar^1$, $Ar^3$, $Ar^5$, $Ar^6$ are identical or different

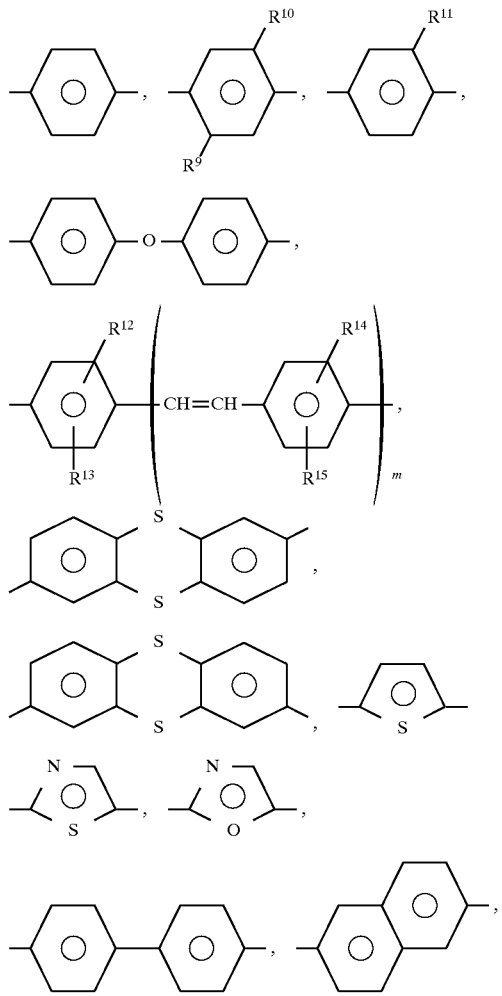

m is from 1 to 20, preferably 1, 2 or 3, particularly preferably 1, preferably only for $Ar^6$ m is>1;

$Ar^2$, $Ar^4$ are identical or different as defined for $Ar^1$, $Ar^3$, $Ar^5$, $Ar^6$, but only one of the two possible binding points to the polymer is realized, or are

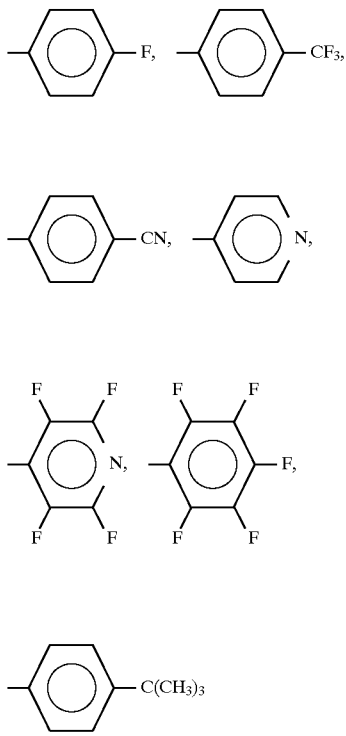

$R^9$–$R^{15}$ are identical or different and are each F, Cl, a straight-chain or branched alkyl or alkoxy group having from 1 to 22, preferably from 1 to 12, carbon atoms, $R^{12-15}$ can also be H.

Very particular preference is given to polymers comprising structural units of the formula (1) in which $Ar^1$ and $Ar^3$ and possibly $Ar^2$ and $Ar^4$ each have the same meaning.

Most preferred are the following groups of polymers comprising structural units of the formula (I):

(Ia)

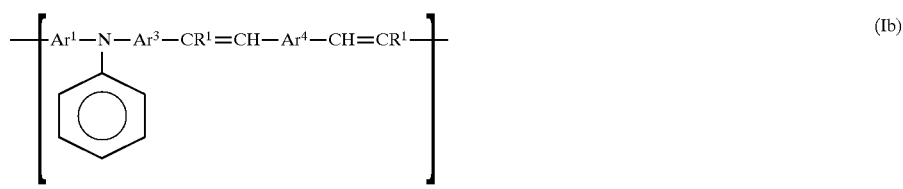

(Ib)

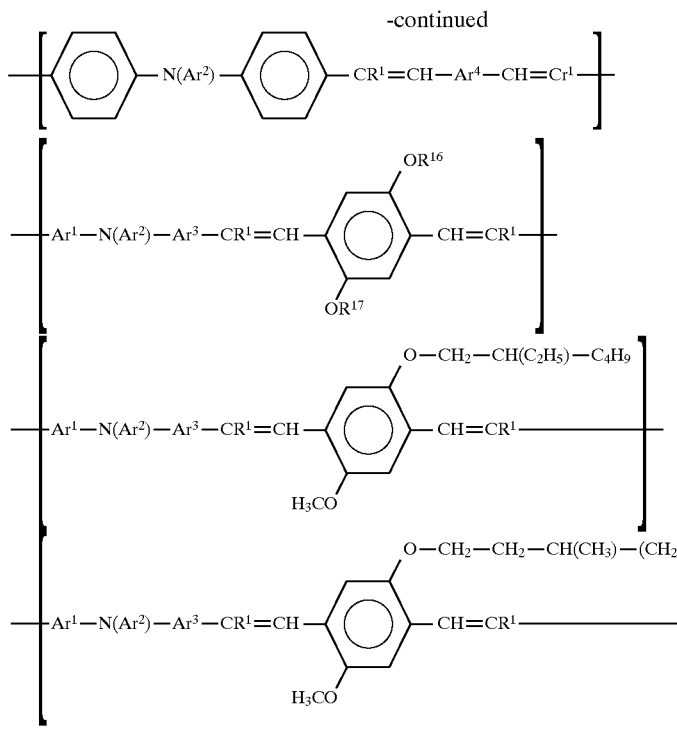

where $R^{16}$, $R^{17}$ are unbranched or branched alkyl groups having from 1 to 12 carbon atoms and the other symbols and indices are as defined above.

Some of the polymers comprising structural units of the formula (I) are known and some are new. The invention accordingly also provides polymers comprising structural units of the formula (I),

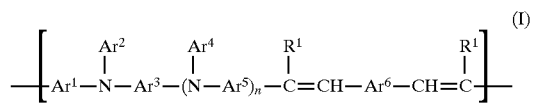

where the symbols and indices have the following meanings:

$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more, preferably one, bridge and/or be condensed, preferably have from 4 to 400, particularly preferably from 4 to 100, very particularly preferably from 4 to 20, carbon atoms and may be unsubstituted or substituted, where $Ar^1$, $Ar^3$, $Ar^5$ and $Ar^6$ are each divalent and $Ar^2$ and $Ar^4$ are each monovalent;

$R^1$ is a hydrocarbon radical having from 1 to 22 carbon atoms which may be unsubstituted or substituted, preferably by F, and can also contain heteroatoms, preferably O, or $Ar^7$, where $Ar^7$ is, independently of $Ar^{1-6}$, as defined for $Ar^{1-6}$;

n is 0, 1 or 2, preferably 0 or 1, particularly preferably 0.

Preferred applications of new polymers comprising structural units of the formula (I) are analogous to those of the abovementioned electroluminescence materials.

Preference is given to polymers consisting of structural units of the formula (I).

The preparation of the polymers of the invention or the polymers used according to the invention is advantageously carried out by condensation of dialdehydes or diketones of the formula (II),

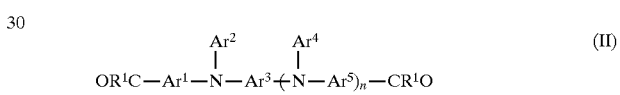

where $Ar^1$, $Ar^2$, $Ar^3$, $Ar^4$, $Ar^5$ and $R^1$ are as defined for the formula (I), organophosphorus compounds of the formula (III)

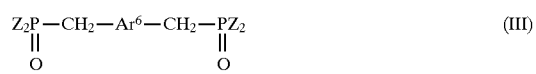

where $Ar^6$ is as defined for the formula (I) and Z is $C_1$–$C_{22}$-alkoxy, preferably ethoxy, or an aryl radical, preferably phenyl.

The condensation is carried out by action of a basic condensation agent, preferably potassium tert-butoxide or sodium hydride.

The polycondensation is advantageously carried out by initially charging the equimolar mixture of the starting components (II) and (III) in a solvent and, under an inert atmosphere and while stirring, introducing preferably at least molar amounts of condensation agent in solution or suspension.

According to another method of proceeding, the condensation agent can also be initially charged alone or with the diketone in a solvent and the bisphosphorus component can be added. As solvent, preference is given to using benzene, toluene, xylene or dimethylformamide, the reaction temperature is preferably from 60° to 120° C. and the reaction time is from 0.1 to 20 hours, preferably from 0.1 to 5 hours, particularly preferably from 0.1 to 1 hour. The reactions proceed virtually quantitatively.

The work-up can be carried out by adding water, if desired an acid such as acetic acid and separating off the organic reaction phases. The condensation products obtained can be extracted for the purposes of purification, e.g. using alcohols or acetic acid, or can be precipitated from solution in a solvent by means of a non-solvent.

This method of preparation is described in general terms in, for example, DD 84 272, Hörhold, H.-H.: Z. Chem. 1972, 12, 41–52; Hörhold, H.-H.; Bergmann, R.; Gottschaldt, J.; Drefahl, G.: Acta Chim. Acad. Sci. Hung. 81, 239–251; Hörhold, H.-H.; Bergmann, R.: Advances in the Chemistry of Thermally Stable Polymers, Warszawa, Polish Scientific Publishers 1977, 29–48; Hörhold, H.-H.; Helbig, M.: Makromol. Chem., Macromol. Symp. 1987, 12, 229–258 and Hörhold, H.-H.; Helbig, M.; Raabe, D.; Opfermann, J.; Scherf, U., Stockmann, R.; Weiβ, D.: Z. Chem. 1987, 27,126.

If diketones ($R^1 \neq H$) are used in the Horner reaction, E/Z isomers are formed. A further kind of isomers which is possible for diketons ($R^1 \neq H$) and dialdehydes ($R^1 = H$) arises from the possible relative positions of the two double bonds (trans-trans-anti, trans-trans-syn, cis-trans-anti, cis-trans-syn, cis-cis-anti, cis-cis-syn); they are all encompassed by the invention.

The use of different dialdehydes or diketones and/or bisphosphonates gives, in a simple manner, copolymers which have different structural units of the formula (I). In such copolymers, the radicals $R^1$ in the formula (I) may also have different meanings. Furthermore, delayed addition of at least one of the comonomers makes it possible to prepare block copolymers.

Relatively small groups of polymers of the formula (I) in which $Ar^1$ is $Ar^8$—$Ar^8$, where $Ar^8$ is an electron-rich aromatic, preferably thiophen-2,5-ylene, which may also be substituted, can also, as an alternative, be polymerized oxidatively, e.g. using $FeCl_3$ (see, for example, P. Kovacic, N. B. Jones, Chem. Ber. 1987, 87, 357–379; M. Weda, T. Abe, H. Awano, Macromolecules 1992, 25, 5125), or electrochemically (see, for example, N. Saito, T. Kanbara, T. Sato, T. Yamamoto, Polym. Bull. 1993, 30, 285): Polymerization by oxidation

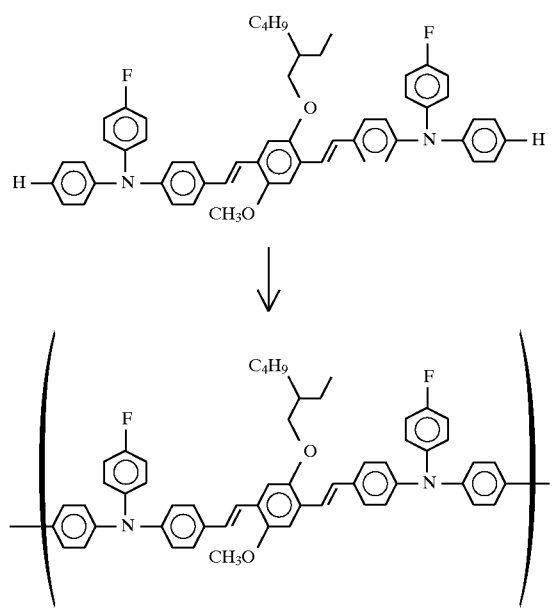

(see, for example, J. March, Advanced Organic Chemistry, 3rd edition, p. 484 ff., McGraw Hill and the literature cited therein).

It can be advantageous, for regulating the molar mass during polymerization, to add monofunctional aldehydes or ketones so as to form defined end groups, for example the commercially available (from H. W. Sands, Jupiter, Fla., USA) 4-(N,N-diphenylamino)benzaldehyde:

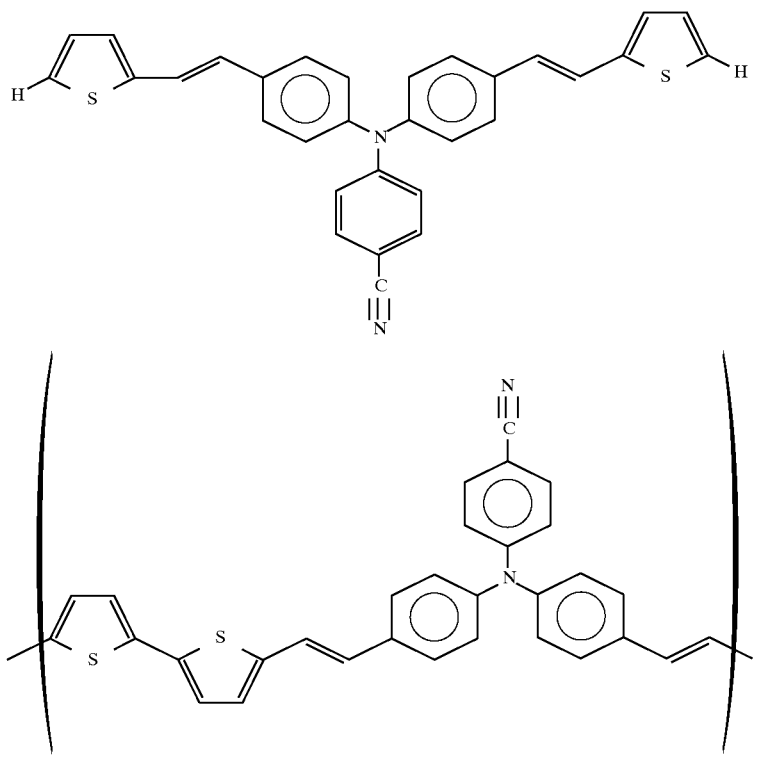

It is likewise possible to oxidatively couple aromatic compounds under the conditions of the Scholl reaction:

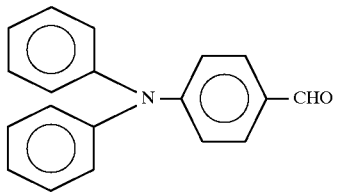

If two mol of a monofunctional aldehyde or ketone such as 4-(N,N-diphenylamino)benzaldehyde are used together with one mol of an organophosphorus compound of the formula (III), this gives sesquimers of the formula (Ia),

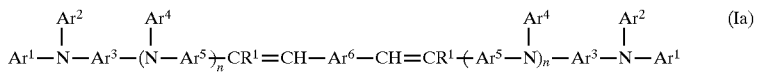

where the symbols and indices are as defined and preferred for the formula (I).

Such compounds are likewise suitable, in particular in admixture with the polymers of the invention, as electroluminescence materials.

In the polymerization of starting compounds having meta-substituted structural elements, macrocyclic compounds can be formed. The polymers of the invention or to be used according to the invention can therefore also be in the form of mixtures of these macrocyclic compounds, which does not interfere with their use as electroluminescence materials.

The starting compounds (II) and (III) are prepared by literature methods known per se, as are described in standard works on organic synthesis, e.g. Houben-Weyl, Methoden der Organischen Chemie, Georg-Thieme-Verlag, Stuttgart.

They are prepared under reaction conditions which are known and suitable for said reactions. Use can also be made of variants known per se which are not discussed in more detail here.

The bis(diphenylphosphine oxides) or bis(phosphonic esters) required as condensation components are easily obtainable, for example, from the corresponding bis (halomethyl) compounds and ethyl diphenylphosphinite $(C_6H_5)_2P$-$O$-$C_2H_5$ or triethyl phosphite using the Michaelis-Arbusov reaction.

The synthesis of dialdehydes of the formula (II) can be carried out by various types of reaction with which those skilled in the art are familiar.

Thus, aldehydes can be obtained, for example, from bis(carboxylic acid) derivatives by controlled reduction with reducing agents such as lithium

tris(alkoxyalanates) or $H_2$/Pd ("Rosenmund reduction"): (see, for example, Fuson in Patai, "The Chemistry of the Carbonyl Group", Vol. 1, pp. 211–232, Interscience, New York 1966)

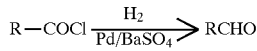

(see, for example, Tylander, "Catalytic Hydrogenation over Platinum Metals", pp. 398–404, Academic Press, New York 1967).

Dialdehydes can be obtained from bis(chloromethyl) precursors, for example by the Sommelet reaction

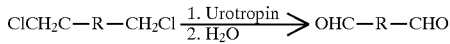

(see, for example, Angyal, Organic Reactions 1954, 8, 197)

However, preference is given to subjecting the parent amines (IV) and (V)

$$H-Ar^1-N-Ar^3-H \quad\quad (IV)$$
$$\quad\quad\quad | \quad\quad\quad\quad$$
$$\quad\quad\quad Ar^2 \quad\quad\quad\quad$$

-continued

to an electrophilic aromatic substitution.

Numerous methods are known for this, for example the Gattermann-Koch reaction:

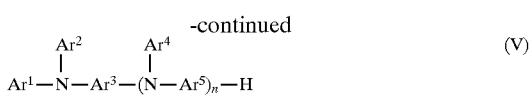

(see, for example, Crounse, Organic Reactions 1949, 5, 290–300); the Gattermann reaction:

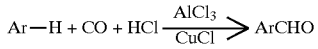

(see, for example, Truce, Organ. Reactions 1957, 9, 37–72); or the reaction of aromatics with dichloromethyl methyl ether:

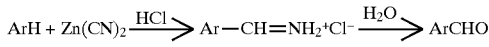

(see, for example, Rieche et al., Chem. Ber. 1960, 93, 88 or Lewin et al., Org. Prep. Proced. Int. 1978, 10, 201).

However, preference is given to the Vilsmeier reaction (also using DMF):

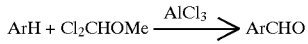

(see, for example, Jutz in Advances in Organic Chemistry, Vol. 9, Part 1 pp. 225–342, Böhme, Viche Eds. Interscience, New York 1976, or Jackson, J. Am. Chem. Soc. 1981, 103, 533).

If $R^1$ in the formula (I) is not hydrogen, diketones are used as starting materials.

These can be prepared, for example, by the above-described Vilsmeier reaction if the amide used is not a formamide.

Furthermore, diketones can be prepared by the Friedel-Crafts acylation:

-continued

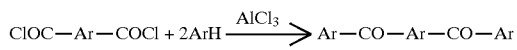

(see, for example, Olah, Friedel-Crafts and Related Reactions, vol. 2, 979–1047, Interscience, New York 1963–65); or by a Grignard reaction with cyanoarylene:

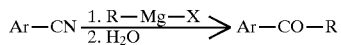

(see, for example, Kharasch and Rainmuth, Grignard Reactions of Nonmetallic Substances, pp. 767–845, Prentice Hall, Englewood Cliffs N.J. 1954).

Starting compounds for dialdehydes and diketones are the tertiary, aromatic amines (IV) and (V). They can be prepared by known reactions with which those skilled in the art are familiar.

An overview of the industrial preparative processes for tertiary and secondary aromatic amines may be found, for example, in McKetta, Encyclopedia of Chemical Processing and Design, Vol. 3, pp. 134–196, Decker, New York.

Starting from secondary aromatic amines, tertiary aromatic amines can also be prepared, for example, by the process indicated in Scheme 1.

Scheme 1

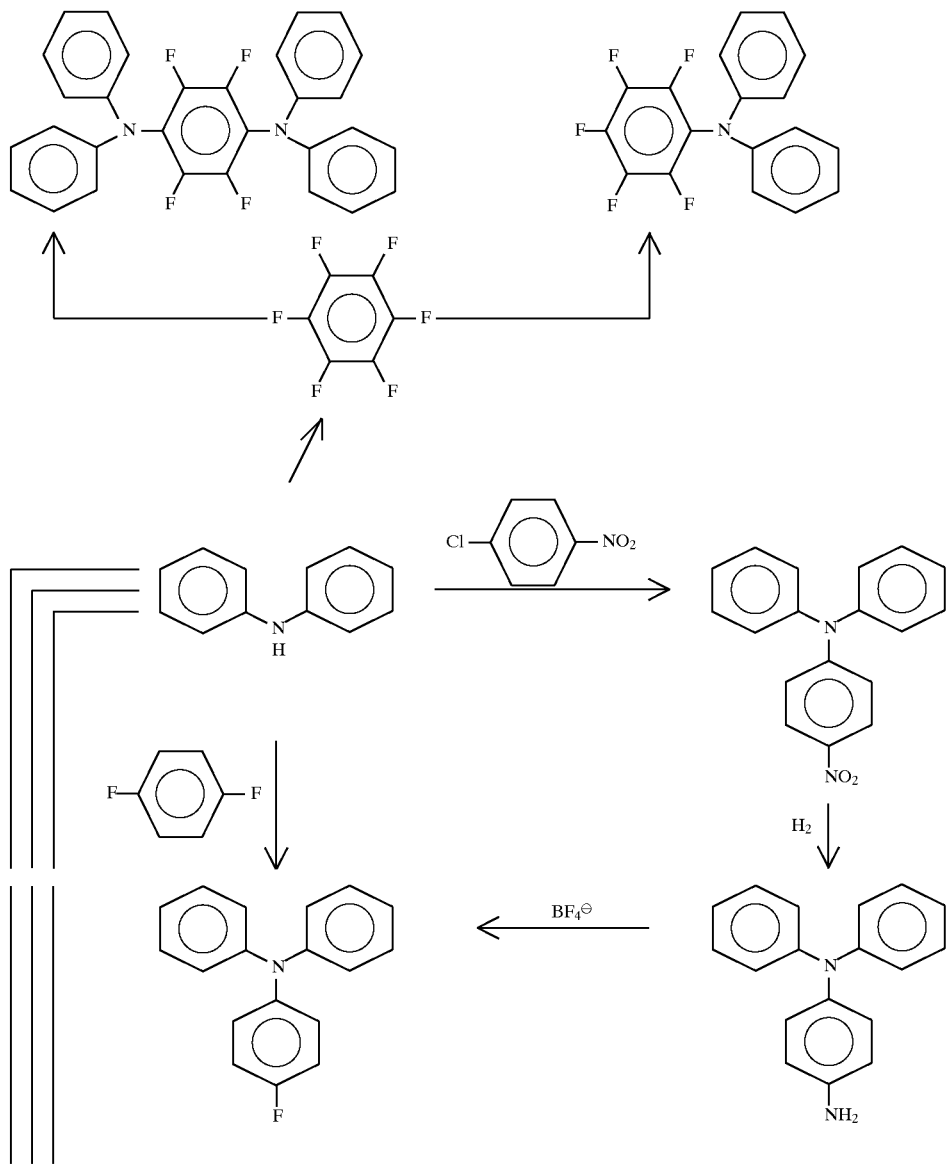

-continued
Scheme 1

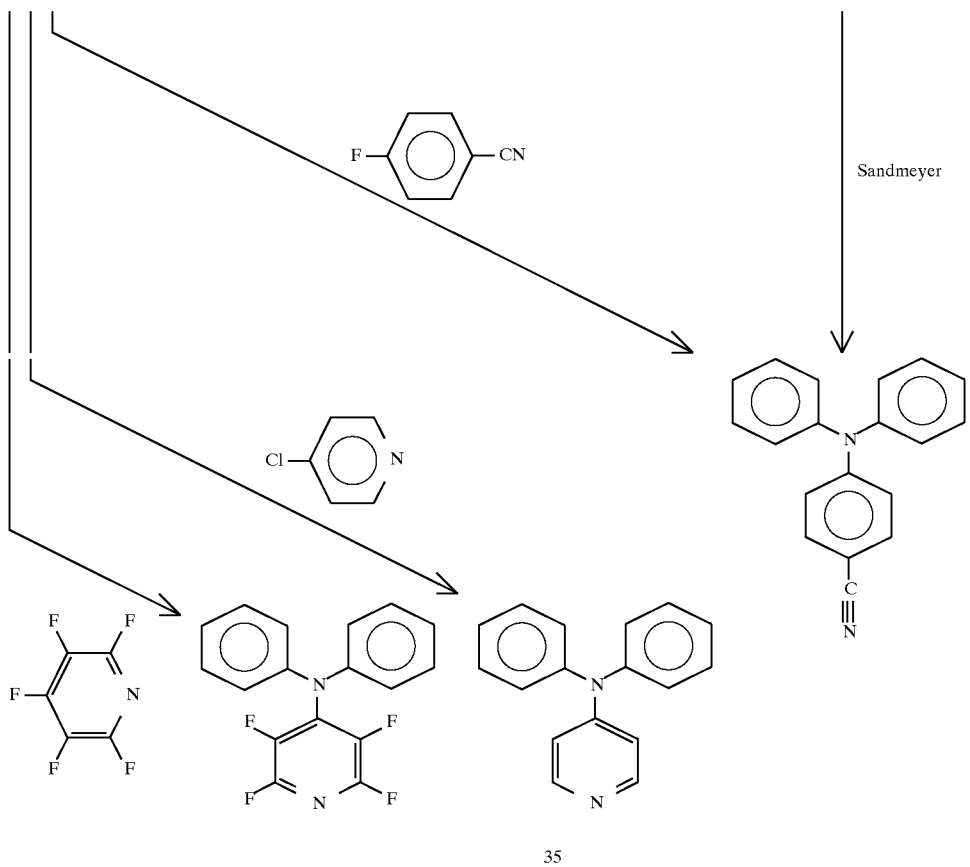

If alkyl-substituted amino aromatics are reacted with iodoaromatics under copper catalysis, it is possible to obtain, for example, N-(alkylaryl)-diarylamines:

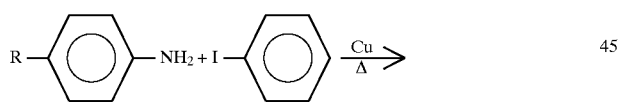

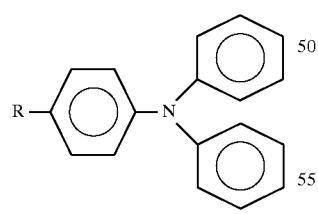

R: alkyl, preferably $C_1$–$C_{22}$, particularly preferably t-butyl or neopentyl.

As starting material for compounds in which $Ar^3$ is a biphenyl group, it is possible to use, for example, the commercially available (from H. W. Sands, Jupiter, Fla., USA) N,N'-diphenyl-N,N'-di-m-tolylbenzidine.

Starting compounds for polymers of the formula (I) in which n is 1 can be prepared, for example, according to the following Scheme 2:

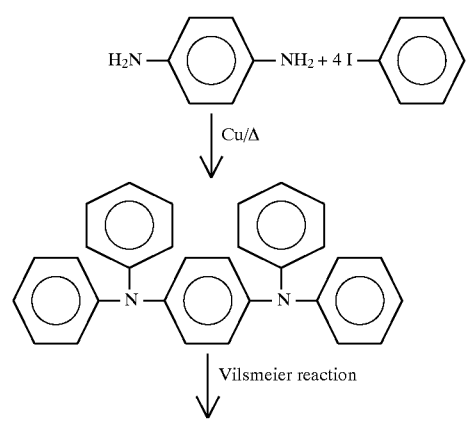

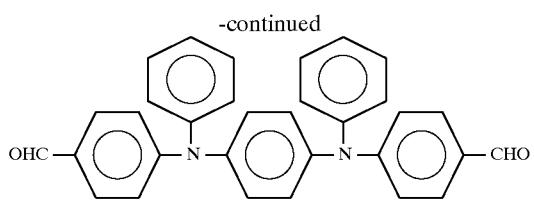

To be used as electroluminescence materials, the polymers comprising structural units of the formula (I) are generally applied in the form of a film to a substrate by methods with which those skilled in the art are familiar, for example dipping or spin coating.

The invention accordingly also provides a process for producing an electroluminescence material, which comprises a) condensing an organophosphorus compound of the formula (III)

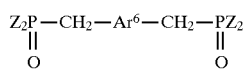

with a dialdehyde or diketone of the formula (II)

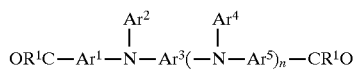

under the action of a basic condensation agent to give a polymer comprising structural units of the formula (I),

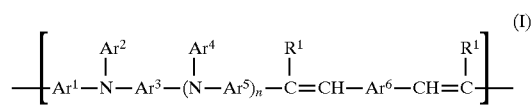

where the symbols and indices have the following meanings:

$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more, preferably one, bridge and/or be condensed, preferably have from 4 to 400, particularly preferably from 4 to 100, very particularly preferably from 4 to 20, carbon atoms and may be unsubstituted or substituted, where $Ar^1$, $Ar^3$, $Ar^5$ and $Ar^6$ are each divalent and $Ar^2$ and $Ar^4$ are each monovalent;

$R^1$ is a hydrocarbon radical having from 1 to 22 carbon atoms which may be unsubstituted or substituted, preferably by F, and can also contain heteroatoms, preferably O, or $Ar^7$, where $Ar^7$ is, independently of $Ar^{1-6}$, as defined for $Ar^{1-6}$;

n is 0, 1 or 2, preferably 0 or 1, particularly preferably 0. and b) applying the resulting polymer comprising structural units of the formula (I) in the form of a film to a substrate which may, if desired, comprise other layers.

The invention further provides an electroluminescence device having one or more active layers, where at least one of these active layers comprises one or more polymers of the invention. The active layer can be, for example, a light-emitting layer and/or a transport layer and/or a charge-injection layer.

The general structure of such electroluminescence devices is described, for example, in U.S. Pat. No. 4,539,507 and U.S. Pat. No. 5,151,629. Polymer-containing electroluminescence devices are described, for example, in WO-A 90/13148 or EP-A 0 443 861.

They usually comprise an electroluminescing layer between a cathode and an anode, with at least one of the electrodes being transparent. In addition, one or more electron-injection and/or electron-transport layers can be inserted between the electroluminescencing layer and the cathode and/or one or more hole-injection and/or hole-transport layers can be inserted between the electroluminescencing layer and the anode. Suitable cathodes are preferably metals or metallic alloys e.g. Ca, Mg, Al, In, Mg/Ag. Suitable anodes are metals, e.g. Au, or other materials which are metallic conductors, e.g. ITO (indium oxide/tin oxide), on a transparent substrate, e.g. of glass or a transparent polymer.

In operation, the cathode is placed at a negative potential relative to the anode. In this way, electrons from the cathode are injected into the electron-injection layer/electron-transport layer or directly into the light-emitting layer. Holes from the anode are simultaneously injected into the hole-injection layer/hole-transport layer or directly into the light-emitting layer.

The injected charge carriers move towards one another through the active layers under the action of the applied voltage. This leads, at the interface between charge-transport layer and light-emitting layer or within the light-emitting layer, to electron/hole pairs which recombine with emission of light.

The color of the emitted light can be varied by means of the material used as light-emitting layer.

Electroluminescence devices are used, for example, as self-illuminating display elements such as control lamps, alphanumeric displays, signs, and in optoelectronic couplers.

The examples illustrate the invention without constituting a limitation.

In the examples, $T_g$: Glass transition temperature measured by means of differential scanning calorimetry (DSC)

$M_n$: Number average of the molecular weight

VPO: Vapor Pressure Osmometry (see, for example, Cherdron, Kern, Braun, Praktikum der Makromolekularen Chemie)

GPC: Gel permeation chromatography, standard: Polystyrene

MS: Mass spectrometry

UV/VIS: UV/VIS spectroscopy

EXAMPLES

Synthetic route:

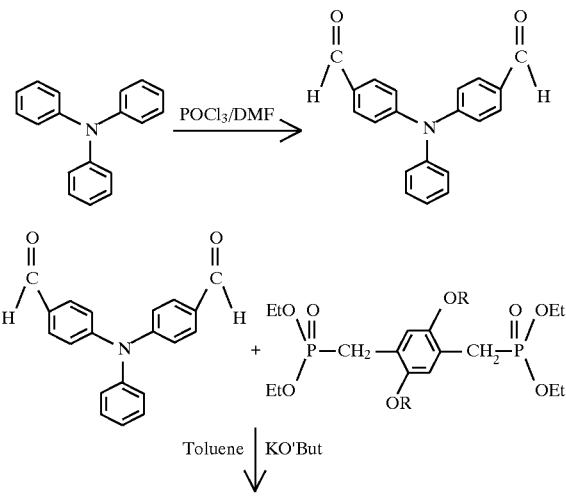

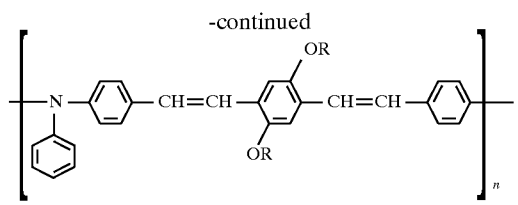

Example 1

4,4'-Diformyltriphenylamine

| Triphenylamine | [245.35] = 5 g | (0.020 mol) |
| --- | --- | --- |
| Phosphoryl chloride | [153,33] = 13.74 g | (0.089 mol) |
| Dimethylformamide | [73.10] = 6.54 g | (0.089 mol) |

Phosphoryl chloride and DMF were mixed with exclusion of moisture and ice-cooling and after twenty minutes the triphenylamine was added in portions. The mixture was then stirred for eight hours at 80° C., poured onto 300 g of crushed ice, allowed to come to room temperature and extracted with chloroform. After taking off the solvent, the dark green oil was taken up in toluene and filtered through a glass filter frit covered with a bed of neutral aluminum oxide. The clear yellow solution was evaporated to dryness and recrystallized from petroleum ether/toluene. This gave yellow crystals in 71% yield. Melting point: 142° C.

$C_{20}H_{15}NO_2$(301.31): calc. C: 79.71 H: 5.01 N: 4.64 found C: 80.12 H: 5.16 N: 4.58

$^1$H-NMR($CD_2Cl_2$) δ=7.1–7.8 (m, 13 aromatics), 9.8 (s, 2 CHO)

Example 2

2,5-Dioctyloxy-1,4-bis(bromomethyl)benzene 22 g of hydroquinone dioctyl ether (0.066 mol), 27.8 g of paraformaldehyde (0.927 mol), 34.7 g of sodium bromide (0.337 mol) and 400 ml of glacial acetic acid were heated while stirring to 80° C. in a 1 l three-necked flask fitted with stirrer, reflux condenser and dropping funnel, and a mixture of 35 ml of concentrated sulfuric acid and 45 ml of glacial acetic acid was added dropwise over a period of one hour. The mixture was left stirring for 5 hours at 80° C. and was then allowed to cool to room temperature. The precipitated solid was filtered off with suction and washed a number of times with water. The organic filtrate was carefully poured into 500 ml of distilled water and extracted a number of times with methylene chloride. After combining the extract with the solid, it was dried over $CaCl_2$ and the solvent was subsequently distilled off. Recrystallization of the residue from hexane gave a mat of white crystals, melting point 83° C.

Yield: 26.6 g=77% of theory $C_{24}H_{40}Br_2O_2$ calc. C 55.40 H 7.60 Br 30.72 (520.366) found C 55.56 H 7.69 Br 30.08

Example 3

2,5-Dioctyloxy-1,4-xylylenebis(diethyl phosphonate)

20.81 g of 2,5-dioctoxy-1,4-bis(bromomethyl)benzene (0.04 mol) and 13.29 g of triethyl phosphite (0.08 mol) were heated to 130° C. in a 250 ml two-necked flask fitted with magnetic stirrer and distillation attachment, with the ethyl bromide formed distilling off. The mixture was heated to 190° C. over a period of 1 hour and stirred for a further 3 hours at this temperature. To remove remaining triethyl phosphite, vacuum was applied for another 30 minutes at this temperature. After cooling, the residue solidified to give a wax-like mass which was recrystallized from petroleum ether. This gave fine white crystals, melting point 41° C. (literature melting point: 41° C.

Yield: 20.8 g=82% of theory.

Example 4

Poly(phenylimino-1,4-phenylene-1,2-ethenylene-2,5-dioctoxy-1,4-phenylene-1,2-ethenylene-1,4-phenylene)

| 2,5-dioctoxy-p-xylene-bis(diethyl phosphonate) | [634.18] = 4.20 g (0.006 mol) |
| --- | --- |
| 4,4'-diformyltriphenylamine | [301.31] = 2.00 g (0.006 mol) |
| potassium tert-butoxide | [112.21] = 2.00 g (0.017 mol) |
| Solvent: toluene | |

4.2 g of diphosphonate and 2.0 g of dialdehyde were, under protective gas, dissolved in as little toluene as possible (about 20 ml) at the boiling point and admixed with 2.0 g of solid potassium tert-butoxide while stirring. The reaction mixture foamed violently and suddenly became viscous. After a few minutes, further toluene (about 10 ml) was added carefully so that the mixture remained stirrable. After two hours, the solvent was taken off under reduced pressure, the residue was taken up in chloroform with warming and was precipitated in isopropanol. After filtration with suction, the solid was extracted for five hours with methanol. The polymer was obtained as yellow, lustrous fibers in 86% yield.

| UV/VIS spectroscopy: | $\lambda_{max}$ = 443 nm (lg ε 4.7) second maximum at 475 nm 0.1 $\lambda_{max}$ = 494 nm |
| --- | --- |
| DSC | glass transition temperature = 79° C. |
| Fluorescence spectroscopy: | $\lambda_{max}$ = 494 nm 0—0 transition at 480 nm |
| Electrochemistry: | DPP:$E^{OX1}$ = 0.67 V$E^{OX2}$ = 0.74 V according to CV, both steps are reversible |
| Molecular weight: | Mn = 22600 (VPO) Mw = 55400 (GPC) |
| Band gap: | E = 2.51 eV (0.1 $\lambda_{max}$ UV) E = 2.58 eV (0—0 transition) |

Example 5

Electroluminescence device

A solution of the polymer from Example 4 in chlorobenzene (20 mg/ml) was applied by spin coating at 1000 rpm under nitrogen to a glass support coated with ITO (indium-tin oxide) (structured, strips 2 mm wide). The glass support was transferred via a lock with maintenance of the protective gas atmosphere into a high-vacuum vapor deposition unit. At $2 \times 10^{-5}$ mbar, Ca strips (2 mm wide, 230 nm thick) were vapor deposited onto the polymer layer at right angles to the ITO strips using a mask. The device thus obtained, viz. ITO/polymer/Ca, was placed in a sample holder and the electrodes were connected via spring finger contacts to a power source, with an ITO strip being made positive and a Ca strip being made negative. On application of a sufficiently high voltage, a green electroluminescence from the corresponding matrix element was observed.

Threshold voltage: 6.7 V
Max. efficiency: 0.047% at 10.0 V and 0.003 A/cm$^2$
Max. radiant intensity: 60 Cd/m$^2$

Example 6

2,5-Dioctoxy-1,4-bis (4-diphenylaminostyryl) benzene

Synthetic route

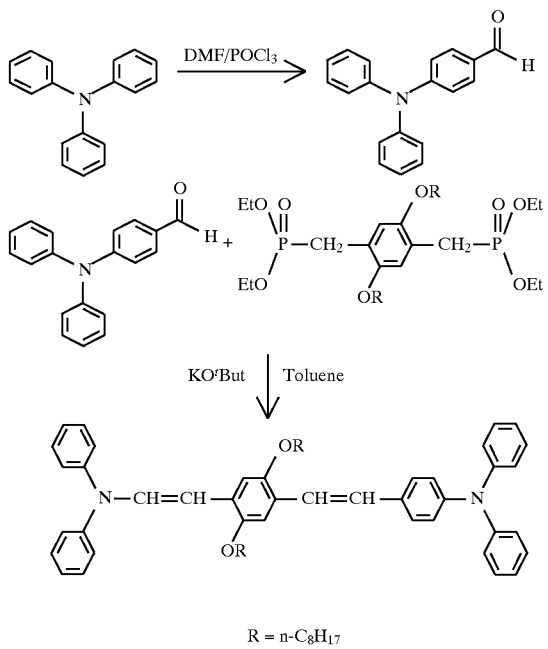

R = n-C$_8$H$_{17}$

4-Diphenylaminobenzaldehyde [273.31] = 1.3 g (0.0047 mol)
2,5 Dioctoxy-p-xylylene-bis(diethyl phosphonate) [634.18] = 1.5 g (0.0023 mol)
Potassium tert-butoxide [112.21] = 0.5 g (0.0047 mol)
Solvent: toluene The diphenylaminobenzaldehyde and the bisphosphonate were placed in 150 ml of toluene under protective gas. While stirring, the potassium tert-butoxide was added in one portion at the boiling point, with the mixture foaming strongly. The mixture was left stirring for a further two hours at 80° C. and was then hydrolyzed with 200 ml of a 10% strength acetic acid solution. The mixture was stirred vigorously and then transferred to a separating funnel. The organic phase was shaken a number of times with water and was then dried over anhydrous sodium sulfate. It was then evaporated to a small volume and the crude product was purified by column chromatography (neutral aluminum oxide, eluant: toluene). Taking off the solvent and drying gave brilliant orange crystals in 82% yield.

analytical data: UV/VIS: $\lambda_{max}$=423 nm Ig $\epsilon$=4.8 $E_g^{OPT}$= 2.60 eV Mp (DSC)=131° C.

molecular weight (MS)=873 (molecular peak)

oxidation potential $E^{OXI}$=0.71 V relative to Ag/AgCl

Example 7

Poly[phenylimino-1,4-phenylene-1-phenyl-1,2-ethenylene-2,5-dioctoxy-1,4-phenylene-2-phenyl-1,2-ethenylene-1,4-phenylene]

Synthetic route

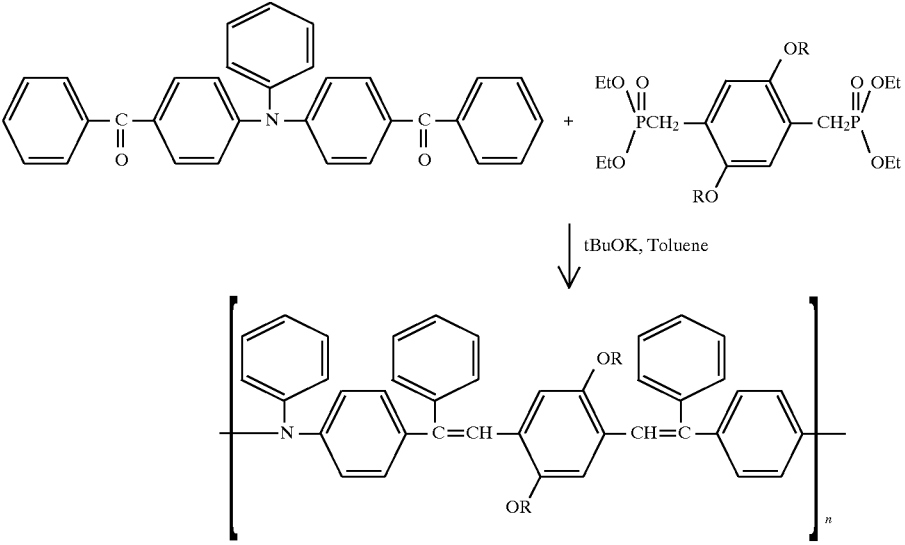

R = n-C$_8$H$_{17}$

-continued

| 4,4'-Dibenzoyltriphenylamine | = 0.0047 mol |
| 2,5-Dioctoxy-p-xylylenebis-(diethyl phosphonate) | = 0.0047 mol |
| potassium tert-butoxide | = 0.0178 mol |
| Solvent: toluene | |

4,4'-Dibenzoyltriphenylamine [mp. 143° C., S. Staskun, J. Org. Chem. 1968, 33, 3031], which was obtained by direct Friedel-Crafts benzoylation of triphenylamine, was, together with the bisphosphonate, dissolved while stirring and under protective gas in as little toluene as possible (about 30 ml) at the boiling point and admixed with solid potassium tert-butoxide. The mixture became viscous after a short time, it was diluted with further toluene (3×10 ml), heated for a further 3 hours and worked up as in the above-described examples. Yellow polymer, $M_n$>4000 (VPO).

Example 8

Poly(phenylimino-1,4-phenylene-1,2-vinylene-1,3-phenylene-1,2-vinylene-1,4-phenylene)

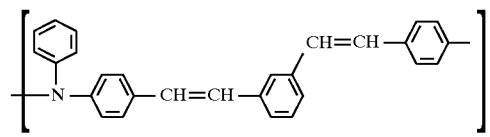

4,4'-Diformyltriphenylamine
1,3-Phenylenebis(methylene(diethyl phosphonate))
Potassium tert-butoxide 1.500 g (5 mmol) of the dialdehyde described in Example 1 together with 1.89 g (5 mmol) of the bisphosphonate were dissolved in 50 ml of toluene under inert gas and with heating. At 100° C., 1.232 g (11 mmol) of the base suspended in 10 ml of toluene were added all at once. The reaction mixture foamed and became viscous. After one hour under reflux, the mixture was worked up by precipitation in methanol as described in Example 4.

Yield: 41% data

Example 9

A solution of the polymer from Example 8 in chlorobenzene (20 mg/ml) was applied by spin coating at 1000 rpm under nitrogen to a glass support coated with ITO (indium-tin oxide) (structured, strips 2 mm wide). The layer thickness of the polymer was 95 nm. The glass support was transferred via a lock with maintenance of the protective gas atmosphere into a high-vacuum vapor deposition unit. At 2×10$^{-5}$ mbar, Ca-strips (2 mm wide, 230 nm thick) were vapor deposited onto the polymer layer at right angles to the ITO strips using a mask. The device thus obtained, viz. ITO/polymer/Ca, was placed in a sample holder and the electrodes were connected via spring finger contacts to a power source, with an ITO strip being made positive and a Ca-strip being made negative. On application of a sufficiently high voltage, a blue-greenish electroluminescence from the corresponding matrix element was observed ($\lambda_{max}$=437 nm).

Threshold voltage: 3.4 V

Max. efficiency: 0.11% at 5.4 V and 3.8 mA from 3×3 mm

Layer thickness: 95 nm

Example 10

Poly[(N-phenylimino-1,4-phenylene-1,2-(1-phenyl)-ethenylene-1,4-(2,5-dimethoxy)phenylene-1,2-(2-phenyl)ethenylene-1,4-phenylene)]

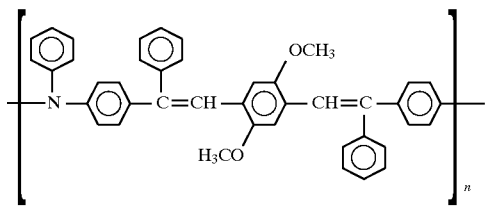

| 4,4'-Dibenzoyltriphenylamine: | 1.80 g (4 mmol) |
| 2,5-Dimethoxy-p-xylylenebis(diethyl phosphonate): | 1.74 g (4 mmol) |
| Potassium-tert-butoxide: | 1.80 g (16 mmol) |

4,4'-Bibenzoyltriphenylamine and 2,5-dimethoxy-p-xylylenebis-(diethyl phosphonate) were dissolved in 15 ml toluene with heating. Potassium-tert-butoxide was added under argon. The reaction mixture was stirred for 6.5 h at 110° C. Afterwards some toluene was added to lower the viscosity and after cooling the mixture was hydrolyzed with 50 ml of a 10% strength acetic acid solution. The organic phase was separated off, the aqueous phase was extracted with toluene and the combined organic phases were dried in a water separator.

The solution was evaporated to a small volume and poured into hexane. The precipitated polymer was filtered off with suction, dried, extracted with methanol and dried until constant weight (yellow powder).

Yield: 1.8 g (78%)
$C_{42}H_{33}NO_2$[583.67] TG=181° C.
$M_n$: 5.200 (GPC)
$M_w$: 11.300 (GPC)
UV/VIS: $\lambda_{max}$=408 nm Ig$\epsilon$=4.4 $Eg^{OPT}$=2.60 eV
Fluorescence: $\lambda_{max}$, em=512 $\phi$=25%
Oxidationpotential: $E^{OX1}$=0.80 V vs. Ag/AgCl

Example 11

Poly(phenylimino-1,4-phenylene-1,4-phenylene-phenylimino-3-methyl-1,4-phenylene-1,2-ethylene-2,5-dioctoxy-1,4-phenylene-1,2-ethenylene-2-methyl-1,4-phenylene)

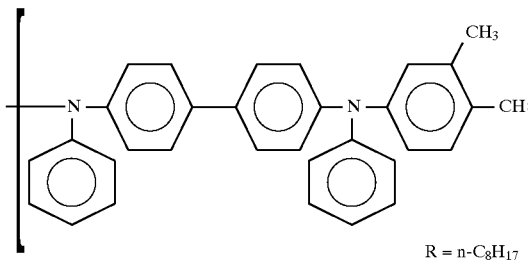
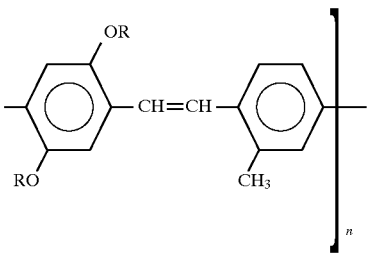

R = n-C$_8$H$_{17}$ 3.00 g 2,5-Dioctoxy-p-xylylenebis(diethyl phosphonate) and 2.70 g of N,N'-bis-(3-methyl-4-formylphenyl)-N,N'-bis-(phenyl)benzidine were dissolved in about 30 ml toluene under inert gas with stirring and were heated to 110° C. 1.05 g of potassium tert.-butoxide was added as a solid in one portion, with the mixture foaming strongly and becoming viscous.

The mixture was left stirring for two hours at boiling temperatur, then 200 ml of toluene were added and the hot solution was filtered off from the slimy residue. The filtrate was evaporated to dryness, dissolved in chloroform and precipicated in isopropanol. Shiny yellow flakes were obtained, which were filtered with suction and dried in vacuo.

Yield: 60%
C$_{64}$H$_{70}$N$_2$O$_2$[898.60]
M$_n$(VPO)<25 000
M$_n$(GPC)=83 000
M$_w$(GPC)=202 000
UV/VIS: $\lambda_{max}$=426 nm Lg$\epsilon$=4.8 Eg$^{OPT}$=2.56 eV
Fluorescence: $\lambda_{max}$, em=497 nm $\phi$=53%
Oxidationspotential E$^{OX1}$=0.68 and 0.75 V vs Ag/AgCl Example 12

An electroluminescence device was prepared according to example 5 employing, the polymer of example 11. A yellow electroluminescence was observed.

Threshold voltage: 2.8 V

Max. efficiency: 0.20% at 5.2 V and 7 mA

Max. radiant intensity 100 Cd/m$^2$

Example 13

Poly(4-fluorophenylimino-1,4-phenylene-1,2-ethenylene-2,5-dioctoxy-1,4-phenylene-1,2-ethenylene-1,4-phenylene)

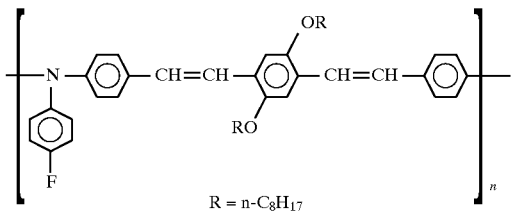

R = n-C$_8$H$_{17}$ a) 4-Fluorotriphenylamine

The compound was prepared from 4-iodo-fluorobenzene and diphenylamine according to Leonard and Sutton, J. Am. Chem. Soc. 1948, 70, 1564.

b) 4-Fluoro-4',4"-diformyl-triphenylamine

| 4-Fluoro-triphenylamine: | 5.00 g (18 mmol) |
| Phosphorylchloride | 14.55 g (94 mmol) |
| N,N-Dimethylformamide | 6.94 g (94 mmol) |

Phosphorylchloride and DMF were mixed with ice-cooling in the absence of moisture. After 20 minutes 4-fluoro-triphenylamine was added and the mixture was stirred for 8 hours at 80° C. The mixture was poured on 300 g of crushed ice, brought to room temperature and extracted with chloroform. After evaporation of the solvent, the dirty-brown solid was dissolved in toluene and filtered over a glass frit filled with neutral aluminum oxide. The clear yellow solution was evaporated to dryness and recrystallized from ether/toluene. Yellow crystals were obtained in 51% yield.

Melting point: 204°–205° C.
C$_{20}$H$_{94}$NO$_2$F (319.29) calc. C: 75.22 H: 4.41 N: 4.38
td. C: 74.92 H: 4.53 N: 4.24
$^1$H-NMR (CD$_2$Cl$_2$) $\delta$=9.8 (s, 2H), 7.81–7.74 (d, 4H), 7.19–7.11 (m, 8H)

c) Polymerization

| 2,5-Dioctoxy-p-xylylenebis(diethyl phosphonate): | 4.13 g (6.5 mmol) |
| 4-Fluoro-4',4"-diformyl-triphenylamine: | 2.08 g (6.5 mmol) |
| Potassium-tert.-butoxide: | 1.50 (13.3 mmol) |
| Solvent: toluene | |

Diphosphonate and bisaldehyde were dissolved in 30 ml toluene at the boiling temperature under inert gas. Potassium-tert.-butoxide was added in solid form with the mixture foaming strongly and instantly becoming viscous. After a few minutes toluene was added cautiously to keep the mixture stirrable. After two hours the solvent was distilled off under reduced pressure, the residue was dissolved in chloroform with heating and precipitated in isopropanol. After filtering off with suction the crude product was extracted for five hours with methanol. The polymer was obtained as yellow, stringy flakes in 78% yield.

M$_n$: 8 300 (gpc)
M$_w$: 28 000 (gpc)

We claim:

1. An electroluminescence device having one or more active layers, where at least one of these active layers is an electroluminescence material, comprising one or more polymers which comprise structural units of the formula (I),

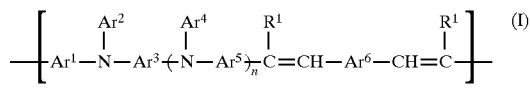

in which the symbols and indices have the following meanings:

Ar$^1$, Ar$^2$, Ar$^3$, Ar$^4$, Ar$^5$, Ar$^6$ are identical or different, monocyclic and/or polycyclic aryl and/or heteroaryl groups which may be linked via one or more bridges and/or be condensed and may be unsubstituted or substituted, where $Ar^1$, $Ar^3$, $Ar^5$ and $Ar^6$ are each divalent and $Ar^2$ and $Ar^4$ are each monovalent;

$R^1$ is H, a hydrocarbon radical having from 1 to 22 carbon atoms which may be unsubstituted or substituted, and can also contain heteroatoms, or $Ar^7$, where $Ar^7$ is, independently of $Ar^{1-6}$, as defined for $Ar^{1-6}$;

n is 0, 1 or 2.

2. An electroluminescence device as claimed in claim 1 comprising one or more polymers which comprise structural units of the formula (I),

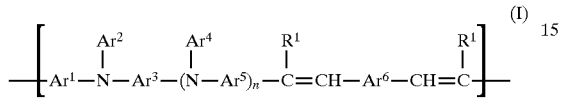

where the symbols and indices have the following meanings:

$Ar^1$, $Ar^2$, $Ar^3$, $Ar^4$, $Ar^5$, $Ar^6$ are identical or different, monocyclic and/or polycyclic aryl and/or heteroaryl groups which may be linked via one or more bridges and/or be condensed and may be unsubstituted or substituted, where $Ar^1$, $Ar^3$, $Ar^5$ and $Ar^6$ are each divalent and $Ar^2$ and $Ar^4$ are each monovalent;

$R^1$ is H, a hydrocarbon radical having from 1 to 22 carbon atoms which may be unsubstituted or substituted, and can also contain heteroatoms, or $Ar^7$, where $Ar^7$ is, independently of $Ar^{1-6}$, as defined for $Ar^{1-6}$;

n is 0, 1 or 2.

3. An electroluminescence device as claimed in claim 1, wherein the polymer or polymers consist(s) of structural units of the formula (I).

4. An electroluminescence device as claimed in claim 1, wherein the polymer or polymers comprising structural units of the formula (I) have from 2 to 1000 structural units.

5. A An electroluminescence device as claimed in claim 3, wherein the polymer or polymers consisting of structural units of the formula (I) have from 2 to 1000 structural units.

6. An electroluminescence device as claimed in claim 1, wherein the polymer comprises different structural units of the formula (I) in which the symbols and indices have the following meanings:

$Ar^1$, $Ar^2$, $Ar^3$, $Ar^4$, $Ar^5$, $Ar^6$, are identical or different, monocyclic and/or polycyclic aryl and/or heteroaryl groups which may be linked via one or more bridges and/or be condensed and may be unsubstituted or substituted, where $Ar^1$, $Ar^3$, $Ar^5$, and $Ar^6$ are each divalent and $Ar^2$ and $Ar^4$ are each monovalent;

$R^1$ is H, a hydrocarbon radical having from 1 to 22 carbon atoms which may be unsubstituted or substituted, and can also contain heteroatoms, or $Ar^7$, where $Ar^7$ is, independently of $Ar^{1-6}$, as defined for $Ar^{1-6}$;

n is 0, 1 or 2, wherein at least one of $Ar^{1-6}$ and $R^1$ in each unit in the polymer is different.

7. An electroluminescence device as claimed in claim 1, wherein the symbols and indices in the formula (I) have the following meanings, $Ar^1$, $Ar^3$, $Ar^5$, $Ar^6$ are identical or different

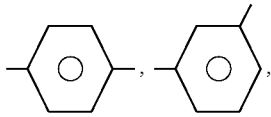

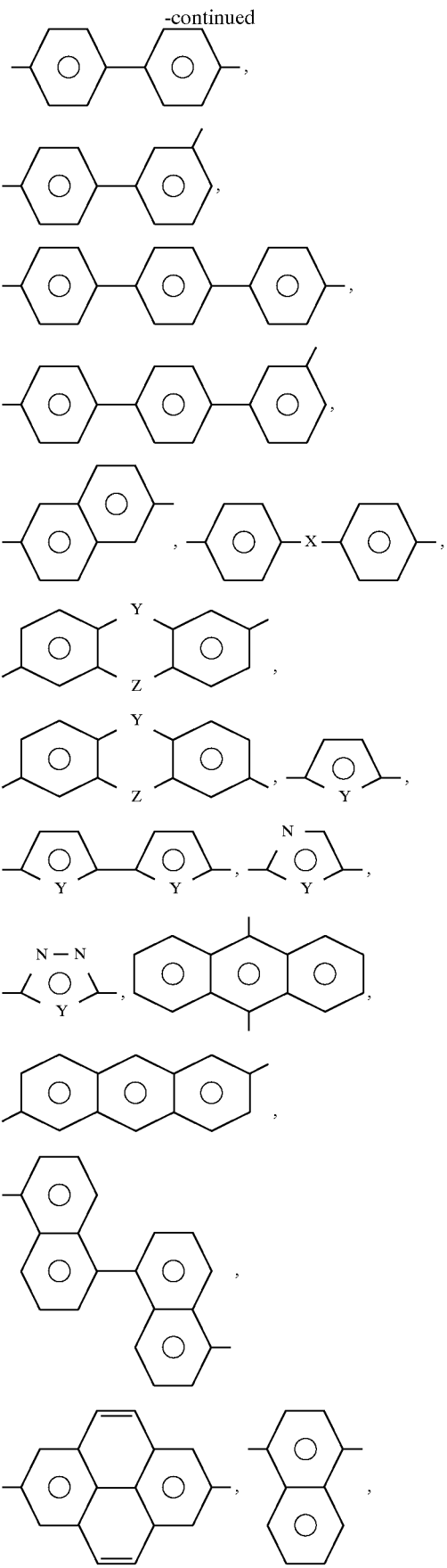

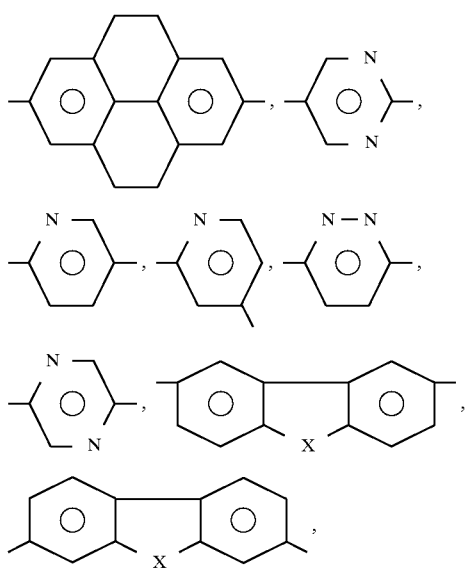

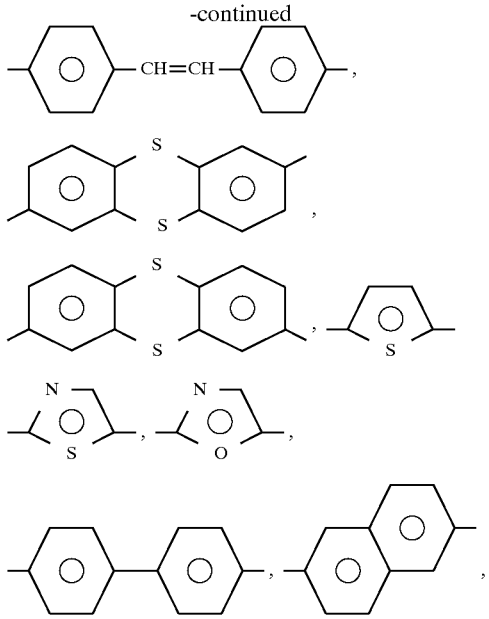

Ar², Ar⁴ are identical to or different from Ar¹ Ar³, Ar⁵ and Ar⁶ and are as defined for Ar¹, Ar³, Ar⁵ and Ar⁶, where only one of the two possible binding points to the polymer is realized in each case;

Ar¹, Ar², Ar³, Ar⁴, Ar⁵, Ar⁶ can be identically or differently substituted by one or more radicals R²–R⁷;

X, Z are identical or different and are each a single bond, —O—, —S—, —SO—, —SO₂—, —CR²R³—, —CR⁴=CR⁵— or —CHR⁶—CHR⁷—;

Y is —O—, —S—, —C(O)— or —NR⁸—;

R¹ is H, a hydrocarbon radical having from 1 to 22 carbon atoms or Ar⁷, where Ar⁷ is as defined for Ar¹ to Ar⁶;

R²–R⁷ are identical or different and are each H, an alkyl group having from 1 to 22 carbon atoms, where it is also possible for one or two non-adjacent CH₂ groups to be replaced by —O—, —S—, —CO—, —CO—O—, —O—OC— or —Si(CH₃)₂—, —CF₃, —Ph, —O—Ph, —S—Ph, —SO—Ph, —SO₂—Ph, F, Cl, Br, I or —CN;

R⁸ is identical to or different from R¹ and is as defined for R¹;

n is 0, 1 or 2.

8. An electroluminescence device as claimed in claim 1, wherein the symbols and indices in the formula (I) have the following meanings:

Ar¹, Ar³, Ar⁵, Ar⁶ are identical or different

Ar², Ar⁴ can be identical or different and be as defined for Ar¹, Ar³, Ar⁵, Ar⁶, but only one of the two possible binding points to the polymer is realized, or are

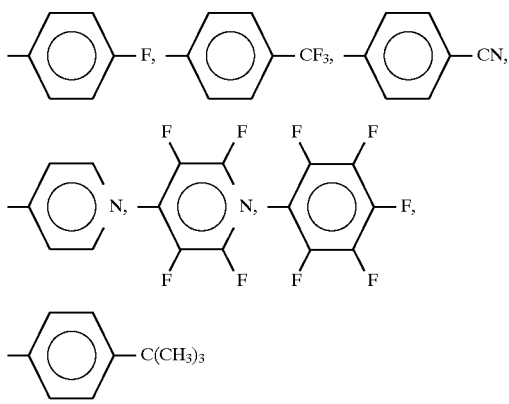

R⁹–R¹¹ are identical or different and are each F, Cl, a straight-chain or branched alkyl or alkoxy group having from 1 to 22 carbon atoms.

9. An electroluminescence device as claimed in claim 1, wherein, in the formula (I), Ar¹ and Ar³ each have the same meanings.

10. An electroluminescence device as claimed in claim 1, wherein, in the formula (I), Ar¹, Ar², Ar³ and Ar⁴ each have the same meanings.

11. An electroluminescence device as claimed in claim 1, wherein R¹ is substituted by F.

12. An electroluminescence device as claimed in claim 1, wherein the heteroatoms in R¹ are O.

13. An electroluminescence device as claimed in claim 1, comprising, one or more polymers which comprise structural units of the formula (I),

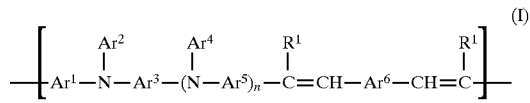

in which the symbols and indices have the following meanings:

Ar$^1$, Ar$^2$, Ar$^3$, Ar$^4$, Ar$^5$, Ar$^6$ are identical or different, monocyclic and/or polycyclic aryl and/or heteroaryl groups which may be linked via one or more bridges and/or be condensed and may be unsubstituted or substituted, where Ar$^1$, Ar$^3$, Ar$^5$ and Ar$^6$ are each divalent and Ar$^2$ and Ar$^4$ ar each monovalent;

R$^1$ is H, a hydrocarbon radical having from 1 to 22 carbon atoms which may be unsubstituted or substituted, and can also contain heteroatoms, or Ar$^7$, where Ar$^7$ is, independently of Ar$^{1-6}$, as defined for Ar$^{1-6}$;

n is 0, 1 or 2, in addition to one or more polymers comprising structural units of the formula (I), one or more compounds of the formula (Ia),

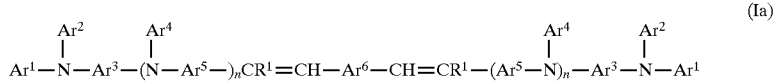

in which the symbols and indices are as defined for the formula (I) and may be identical to or different from those in the polymer comprising structural units of the formula (I).

14. An electroluminescence material, comprising, one or more polymers which comprise structural units of the formula (I),

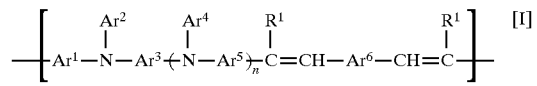

in which the symbols and indices have the following meanings:

Ar$^1$, Ar$^2$, Ar$^3$, Ar$^4$, Ar$^5$, Ar$^6$ are identical or different, monocyclic and/or polycyclic aryl and/or heteroaryl groups which may be linked via one or more bridges and/or be condensed and may be unsubstituted or substituted, where Ar$^1$, Ar$^3$, Ar$^5$ and Ar$^6$ are each divalent and Ar$^2$ and Ar$^4$ ar each monovalent;

R$^1$ is H, a hydrocarbon radical having from 1 to 22 carbon atoms which may be unsubstituted or substituted, and can also contain heteroatoms, or Ar$^7$, where Ar$^7$ is, independently of Ar$^{1-6}$, as defined for Ar$^{1-6}$;

n is 0, 1 or 2, in addition to one or more polymers comprising structural units of the formula (I), one or more compounds of the formula (Ia),

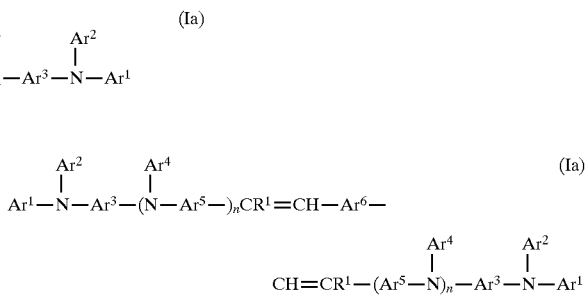

in which the symbols and indices are as defined for the formula (I) and may be identical to or different from those in the polymer comprising structural units of the formula (I).

* * * * *